United States Patent [19]

Lynch

[11] 4,166,249
[45] Aug. 28, 1979

[54] DIGITAL FREQUENCY-LOCK CIRCUIT
[75] Inventor: Frank Lynch, Hatboro, Pa.
[73] Assignee: Honeywell Inc., Minneapolis, Minn.
[21] Appl. No.: 877,984
[22] Filed: Feb. 15, 1978
[51] Int. Cl.² ............................................. H03B 3/04
[52] U.S. Cl. .................................. 328/155; 328/133; 328/44; 328/55; 331/1 A
[58] Field of Search ................. 328/133, 134, 155, 44, 328/55; 331/1 A

[56] References Cited
U.S. PATENT DOCUMENTS

| | | | |
|---|---|---|---|
| 3,781,695 | 12/1973 | Jackson | 328/155 |
| 3,983,498 | 9/1976 | Malek | 328/155 |
| 3,988,696 | 10/1976 | Sharpe | 331/1 A |
| 4,019,153 | 4/1977 | Cox et al. | 331/1 A |
| 4,023,116 | 5/1977 | Alfke et al. | 328/155 X |

Primary Examiner—John S. Heyman
Attorney, Agent, or Firm—Laurence J. Marhoefer; Lockwood D. Burton; Mitchell J. Halista

[57] ABSTRACT

A digital frequency-lock circuit has a binary rate multiplier connected between a fixed frequency oscillator and an output terminal to modify the oscillator output signal in accordance with a digital word. An up/down counter is arranged to supply the digital word to the rate multiplier in accordance with a count stored in the counter. The frequency of the rate multiplier output is compared with an input signal frequency during a cycle of the input signal to maintain a predetermined relationship between the compared frequencies.

6 Claims, 2 Drawing Figures

DIGITAL FREQUENCY-LOCK CIRCUIT

BACKGROUND OF THE INVENTION

The present invention relates to signal generators. More specifically, the present invention is directed to signal generators having controlled frequency output signals.

SUMMARY OF THE INVENTION

An object of the present invention is to provide an improved signal generator circuit.

Another object of the present invention is to provide an improved digital frequency-lock circuit for producing a controlled frequency output signal having a predetermined relationship with respect to the frequency of a monitored signal.

In accomplishing these and other objects, there has been provided, in accordance with the present invention a digital frequency-lock circuit for producing an output signal frequency which is locked to a predetermined multiple of a monitored input signal frequency. The output signal frequency is adjusted during each cycle of the input signal frequency to produce a balanced condition of the circuit represented by the presence of the predetermined multiple relationship.

DESCRIPTION OF THE DRAWINGS

A better understanding of the present invention may be had when the following detailed description is read in connection with the accompanying drawings, in which.

DESCRIPTION OF THE PREFERRED EMBODIMENT

DETAILED DESCRIPTION

Figure 1:
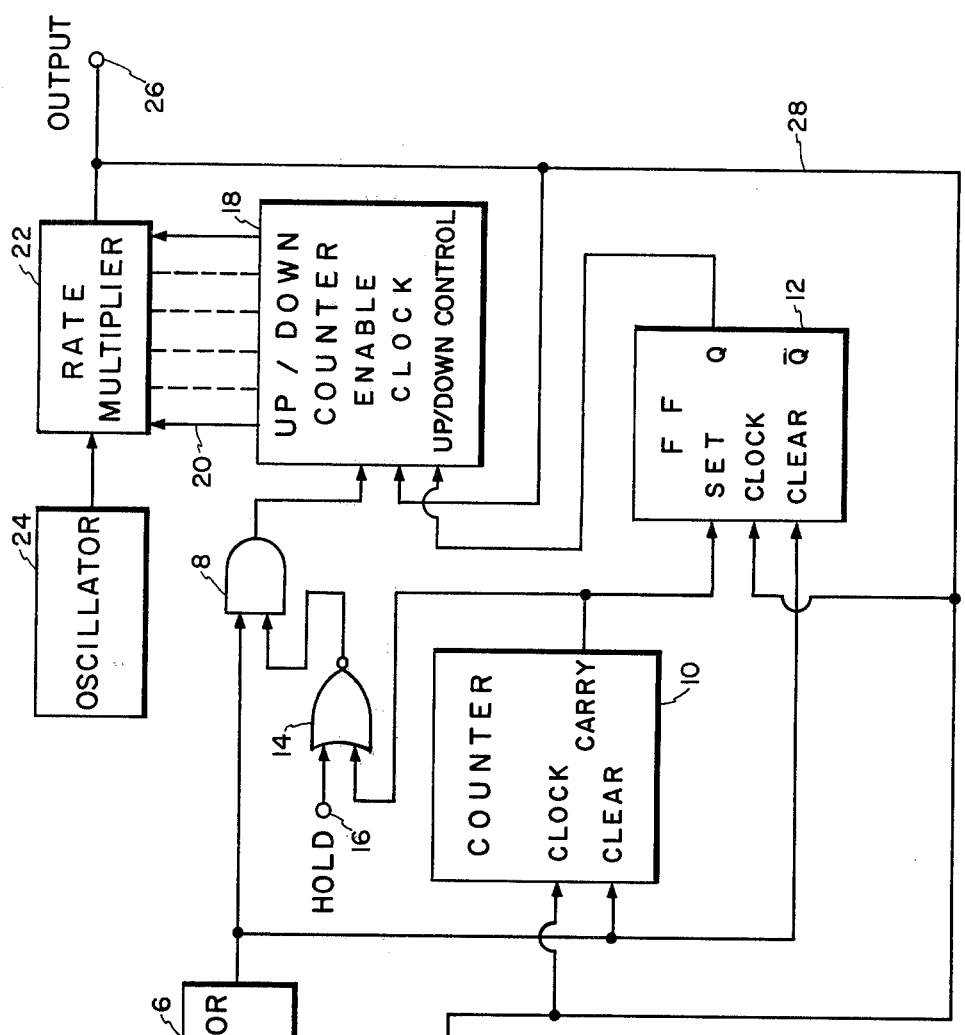
FIG. 1 is a block diagram of an example of a digital frequency-lock circuit embodying the present invention.

Referring to FIG. 1 in more detail, there is shown an example of a digital frequency-lock circuit embodying the present invention for producing an output signal whose frequency is locked to a predetermined multiple of a monitored input signal frequency. An input signal having a variable frequency is applied to an input terminal 2. The reference signal input terminal 2 is connected to the input of a Schmitt trigger 4. The output of the Schmitt trigger 4 is connected to the input of a digital differentiator circuit 6. The digital differentiator circuit 6 may be any suitable logic circuit, i.e., a combination of flip-flops and gates which stores the output of the Schmitt trigger 4 and uses a clock signal to develop a pair of pulses synchronized with the clock signals and defining the period of the square wave signal from the Schmitt trigger circuits, such circuits being well-known in the art. An output of the differentiator circuit 6 is connected to a first input of a two input AND gate 8 and to the "clear" input of a counter 10 and the "clear" input of a flip-flop 12. An "enable" input (not shown) of the counter 10 is continuously energized by any suitable signal to maintain the counter 10 in a continuously enabled state, such an operation being well-known in the art. A "carry" output of the counter 10 is connected to one input of a NOR gate 14 while a second input of the NOR gate 14 is connected to an input terminal 16. The output terminal of the NOR gate 14 is connected to the second input of the AND gate 8. An output of the AND gate 8 is connected to an "enable" input of an up/down counter 18. The output lines from the up/down counter representing the binary number stored in the counter 18 are connected through a rate multiplier 22 which is a binary frequency divider, such device being well-known in the art. An example of a suitable device for the rate multiplier 22 is No. 7497 manufactured by Texas Instruments.

An input to the rate multiplier 22 is obtained from a signal generator or oscillator circuit 24. The output from the rate multiplier is applied to an output terminal 26 and is applied as a clock signal to the clock input of the up/down counter 18, the clock input of the counter 10 and the clock input of the differentiator 6. The "carry" output of the counter 10 is also applied to the set input of a flip-flop 12 which has the clock signal on line 28 applied thereto. The Q output of the flip-flop 12 is applied to the up/down control of the up/down counter to control the counting direction of the up/down counter 18.

Figure 2:
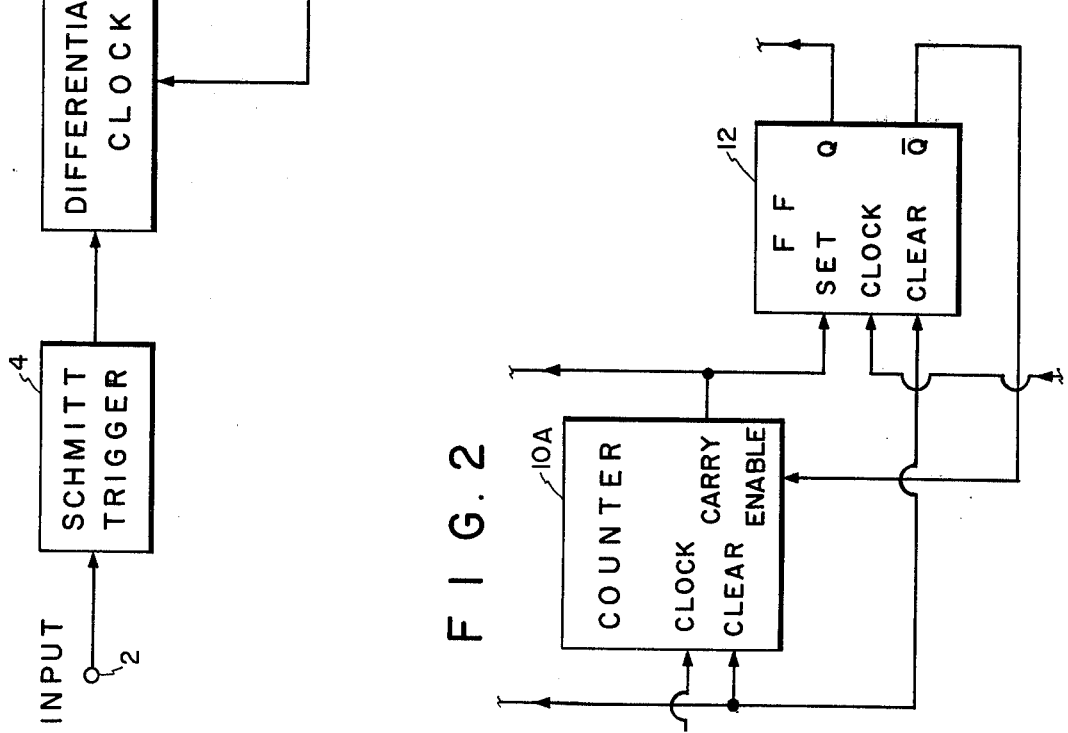
FIG. 2 is a schematic illustration of a modification of a portion of the circuit shown in FIG. 1.

A modified form of the example of an engine shown in FIG. 1 is shown in FIG. 2 in abbreviated form to illustrate the modification without including the remaining circuit elements and connections which are not modified. Specifically, the $\overline{Q}$ output of the flip-flop 12 is connected to an "enable" input of the counter 10 to extend the lower frequency range of the frequency-lock circuit. Thus, the counter 10 in FIG. 1 has its "enable" terminal continuously energized to allow the counter to accept input signals while the counter "enable" terminal in FIG. 2 is selectively energized by the $\overline{Q}$ output of the flip-flop 12. In other words, the "enable" input of the counter 10 has not been shown in FIG. 1 inasmuch as it is continuously energized, in a manner well-known in the art, and does not enter into the operation of the circuit of FIG. 1. In order for the "enable" input to be selectively used, it is disconnected from the aforesaid continuous energization and connected to the $\overline{Q}$ output of the flip-flop 12, as shown in FIG. 2.

DESCRIPTION OF OPERATION

The example of the digital frequency-lock circuit shown in FIG. 1 produces a variable frequency output signal on the output terminal 26. This output frequency is locked to a predetermined multiple (K) of the frequency of the input signal applied to input terminal 2. The multiple (K) is an integral multiple and is the modulus of the counter 10 which produces a carry output upon a count of $2^{K-1}$. In general, the output frequency at the output terminal 26, using a binary rate multiplier 22 and a binary up/down counter 18, is the frequency of the oscillator 24 multiplied by the ratio of the number M stored in the up/down counter 18 divided by $2^N$ where N is the bit length of the rate multiplier 22 and the up/down counter 18. Specifically, after each cycle of the input signal applied to the input terminal 2, the count M in the up/down counter 18 is incremented up or down by one count if necessary to bring the frequency control loop into balance. This control of the up/down counter 18 is performed on the basis of a count by the modulo K counter 10 of the number of clock pulses on line 28 which occur within the period of the reference input signal.

The input signal period is established by a conversion of the input signal into a square wave by the Schmitt trigger 4 and the subsequent differentiation of the resulting square wave by the digital differentiator 6. The differentiated signal is, accordingly, a pair of output pulses separated by the period of one cycle of the input signal on input terminal 2.

If the count by the counter 10 during a cycle of the input signal on input terminal 2 is equal to the modulo K then the count M in the up/down counter 18 is not adjusted and output frequency is retained. If the count is greater than K, the stored count in the up/down counter 18 is reduced by one digit and vice versa to adjust the output frequency by the rate multiplier 22. An adjustment of the stored count in the counter 18 continues until the loop is balanced by having the count in the counter 10 equal to K. Specifically, the differentiated signal from the differentiator 6 is applied to the "clear" input of the counter 10 to clear the counter 10 and is concurrently applied to the "clear" input of flip-flop 12 to similarly clear the flip-flop 12. The counter 10 is cleared on the trailing edge of the first period defining pulse from the differentiator 6. This trailing edge is arranged to be coincident with the start of a cycle of the "clock" signal from the output of the rate multiplier 22 as a result of the "clocking" of the differentiator 6. Thus, the clearing operation of the counter 10 is a synchronous clearing since it occurs at the trailing edge of the differentiator pulse and the start of a clock pulse from the rate multiplier 22. The counter 10, accordingly, has a stored count value of zero for the first clock pulse, a count value of one for the second clock pulse and a $2^{K-1}$ count value for $K^{th}$ clock pulse. Thus, a carry pulse is produced for the $2^{K-1}$ count value which represents K clock pulse.

In other words, the counter 10 counts clock signals on line 28 from the rate multiplier 22 during the period between the input signal differentiated pulses from the differentiator 6. If the end of the input signal cycle as represented by a differentiated signal pulse from the differentiator 6 occurs when the count in the counter 10 is $2^{K-1}$, the clock pulse will be the $K^{th}$ which indicates that the loop is in balance and an adjustment of the output from the rate multiplier 22 is not needed. The up/down counter 18 is, consequently, not "enabled" since a high level "carry" signal is generated by the counter 10 at the $2^{K-1}$ count. The high level "carry" signal is inverted by the NOR gate 14 to a low level signal. The application of this low level signal to one input of the AND gate 8 prevents a high level "enable" signal from the AND gate 8 from being developed, i.e., the output signal from the AND gate 8 is maintained as a low level signal.

On the other hand, if the count from the end of input signal cycle defining pulse from the differentiator 6 occurs when the count in the counter 10 is not $2^{K-1}$, the loop is not in balance, and the up/down counter 18 is enabled to be incremented synchronously on the next clock pulse. The direction of counting by the up/down counter 18 following the enabling of the counter 18 is determined by the Q output of the flip-flop 12. Specifically, if the Q output of the flip-flop 12 is high, at the time of the "enable" pulse to the up/down counter 18, the counter 18 is actuated to reduce its stored count by one. On the other hand, if the flip-flop 12 is low at the time of the enable signal to the counter 18, the up/down control line is not actuated, i.e., is supplied with a low level signal, and the count stored in the counter 18 is increased by one.

The operation of the flip-flop 12 is determined by the application of the "carry" signal from the counter 10 and the "clear" signal from the differentiator 6 as represented by the input signal cycle length defining pulses. Thus, if the "carry" signal from the counter 10 is not present, the input to the NOR gate 14 from the counter 10 is a low level signal which is inverted by the NOR gate 14 to a high level signal and applied to one input of the AND gate 8. At this time, if the second, or end of period, signal from the differentiator 6 is also applied to the AND gate 8 as a second high level signal, the AND gate 8 is enabled to produce a high level output signal which is used as a "enable" signal for the counter 18. Since the flip-flop 12, which had been cleared by the first of the cycle period defining differentiator pulses from the differentiator 6, as previously described, has a low level Q output, the low level Q output of the flip-flop 12 is applied to the counter 18 up/down control and is effective to produce an "up" counting direction of the counter 18. Accordingly, on the next clock pulse on line 28 applied to the clock input of the counter 18, the counter 18 is incremented to increase its stored count by one. This counting condition is indicative of the fact that the frequency on the output terminal 26, which is used as the clock signal on line 28, with respect to input signal on input terminal 2 is too low. Accordingly, the binary number stored in the counter 18 is increased with an effect on the rate multiplier 22 to increase the frequency of the output signal of the rate multiplier 22. Such a decrease in the output frequency is continued for each cycle of the input signal on input terminal 2, as defined by the output pulses from the differentiator 6, until a loop balance is achieved as indicated by having the "carry" signal from the counter 10 occur at the same time as the trailing, or end of period, pulse from the differentiator 6.

The operation of the circuit shown in FIG. 1 for a condition where the frequency of the output from the rate multiplier 22 is too high involves the setting of the flip-flop 12 by a high level "carry" output from the counter 10 before the trailing cycle period defining pulse from the differentiator 6, i.e., the counter 10 produces a carry output before the occurrence of the end of period pulse. Inasmuch as the Q output of the flip-flop 12 is set to a high level by the high level carry output applied to the "set" input of the flip-flop 12, the counter 18 is enabled by the high level Q output to count down. The high level carry output from the counter 18 is terminated upon the next count of the counter 10 to restore a low level output from the carry output and a high level input at the input of the AND gate 8. Accordingly, upon the occurrence of the trailing period defining pulse from the differentiator 6, the AND gate 8 has two high level input signals, and it produces a high level output signal to be applied to the "enable" input of the counter 18. Since the counter 18 has been enabled by the Q output of the flip-flop 12 to count down, or decrease its stored count, the occurrence of the next clock pulse from the clock line 28 is effective to decrease the stored count by one. This count down operation is also continued for each succeeding cycle of the input signal applied to the input terminal 2 until the loop is again in balance by having the carry output from the counter 10 occur at the same time as the trailing period defining pulse from the differentiator 6. Consequently, the circuit shown in FIG. 1 is effective to maintain a predetermined relationship between the output signal on output terminal 26 and the input signal on input terminal 2.

Such a controlled relationship is useful when the input signal on the input terminal 2 is a variable frequency signal, e.g., power line frequency, and is used in other circuitry in conjunction with the much higher output frequency from the output terminal 26. Accordingly, the maintaining of a predetermined relationship between these two signals is essential in order to maintain accuracy, or repeatability, which would be impaired if the number of pulses from the oscillator 24 which occur during each cycle of the input signal applied to the input terminal 22 were allowed to vary. The digital control afforded by the present invention also provides a fail-safe operation in the event of a disappearance of the input signal of the input terminal 2. In this case, the output signal on output terminal 26 will be held at the last frequency determined by the last setting of the rate multiplier 22 since an "enable" signal for the counter 18 is inhibited. A similar type operation may be achieved by the application of a high level "hold" signal to the "hold" input terminal 16 which signal is inverted to a low level signal by the NOR gate 14 and is effective to maintain the output of the AND gate 8 at a low level signal to prevent the enabling of the counter 18. In this fixed state, the rate multiplier 22 is also retained at its last setting.

In FIG. 2, there is shown a modification of the circuitry of FIG. 1 for the purpose of handling a larger change in the frequency of the input signal applied to the input terminal 2. Specifically, with the modification shown in FIG. 2, the frequency of the input signal applied to the input terminal 2 may vary to half of its normal frequency without affecting the operation of the frequency control exercised by the present invention. In this modification, the $\overline{Q}$ output of the flip-flop 12 is connected by a signal line 30 to the enable input of the counter 10. In the embodiment shown in FIG. 1, as previously discussed, the enable input of the counter 10 is continuously energized to make the operation of the counter 10 independent of an "enable" signal. In the modification shown in FIG. 2, the $\overline{Q}$ output of the flip-flop 12 exercises a control over the counter 10 to allow the counter 10 to count only during the presence of a high level $\overline{Q}$ output signal from the flip-flop 12. Thus, if the frequency of the input signal applied to the input terminal 2 drops sufficiently, the counter 10 may be operated to produce more than one carry output signal during the time interval defined by the low frequency of the input signal applied to the input terminal 2. However, the use of the $\overline{Q}$ output of the flip-flop 12 is effective to cancel the effect of all but one of the carry output signals by recognizing only the first of the "carry" signals produced by the counter 10 during the input signal period defined by the output signals from the differentiator 6. Thus, the first "carry" signal is effective to set the flip-flop 12 which produces a low level output signal on the $\overline{Q}$ output of the flip-flop 12. This $\overline{Q}$ output is applied to the enable input of the counter 12 to prevent the counter 12 from continuing its counting operation. Accordingly, in this modification of FIG. 2, the counting operation and adjustment of the rate multiplier 22 is carried out only during the period between the first of the period defining output signals from the differentiator 6 and the first of the "carry" outputs from the counter 10.

Accordingly, it may be seen that there has been provided, in accordance with the present invention, a digital frequency-lock circuit for producing a controlled frequency output signal having a predetermined relationship with respect to the frequency of a monitored signal.

The embodiments of the invention in which an exclusive property or privilege is claimed are defined as follows:

1. A digital frequency-lock circuit comprising
   a fixed frequency source,
   a rate multiplier means having a signal output, a multiplier control input and a signal input connected to an output of said frequency source,
   an up/down counter means having an enable input, a clock input, an up/down control input and a signal output for providing an output signal representing a digital word stored in said counter means,
   first circuit means connecting said signal output of said counter means to said multiplier control input of said rate multiplier means,
   input terminal means arranged to be connected to a source of an input signal having a frequency to be monitored,
   differentiator means for converting a cycle of said input signal to output signals defining a corresponding time period,
   second counter means having a clock input, a clear input and a carry output for providing an output signal representative of a predetermined count in said counter means,
   flip-flop means having a set input, a clock input and a clear input and a first output corresponding to said set input,
   second circuit means for applying said output signals from said differentiator means to said clear inputs of said flip-flop means and said second counter means,
   third circuit means connecting said first output of said flip-flop means to said up/down control input of said up/down counter means,
   signal gating means having an input means connected to receive said output signals from said differentiator means, an output connected to said enable input of said up/down counter means, and a gate control input connected to receive said carry output of said counter means, and
   fourth circuit means connecting said signal output to said clock inputs of said up/down counter means, said flip-flop means and said second counter means.

2. A digital frequency-lock circuit as set forth in claim 1 wherein said rate multiplier is a binary rate multiplier and said digital word stored in said counter is a binary word.

3. A digital frequency-lock circuit as set forth in claim 1 wherein said signal gating means includes an AND gate having a first input connected to said input means of said signal gating means, a second input connected to said gate control input and an output connected to said output of said signal gating means.

4. A digital frequency-lock circuit as set forth in claim 3 wherein said input means of said signal gating means includes a NOR gate having a first input connected to receive said output signals from said differentiator means, a second input arranged to be connected to a source of a control signal and an output connected to said first input of said AND gate.

5. A digital frequency-lock circuit as set forth in claim 1 wherein said flip-flop means includes a second output corresponding to said clear input and said second counter means includes an enable input and further including fourth circuit means connected to said second output of said flip-flop means to said enable input of said second counter means.

6. A digital frequency-lock circuit as set forth in claim 1 and further including an output terminal means connected to said signal output of said rate multiplier means.

* * * * *